(12) United States Patent
Subramanian et al.

(10) Patent No.: US 9,640,788 B2
(45) Date of Patent: May 2, 2017

(54) BATTERY CELL SEPARATOR HAVING CONTOURED PROFILE

(71) Applicant: FORD GLOBAL TECHNOLOGIES, LLC, Dearborn, MI (US)

(72) Inventors: Rajaram Subramanian, Ann Arbor, MI (US); Brian Utley, Canton, MI (US); Suriyaprakash Ayyangar Janarthanam, Westland, MI (US); Dave Moschet, Dearborn, MI (US); Bhaskara Boddakayala, Canton, MI (US); Anil Reddy Pullalarevu, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 62 days.

(21) Appl. No.: 14/466,345

(22) Filed: Aug. 22, 2014

(65) Prior Publication Data

US 2016/0056439 A1 Feb. 25, 2016

(51) Int. Cl.
*H01M 2/18* (2006.01)
*H01M 10/04* (2006.01)
*H01M 10/625* (2014.01)
*H01M 10/6555* (2014.01)
*H01M 10/6554* (2014.01)
*H01M 10/613* (2014.01)
(Continued)

(52) U.S. Cl.
CPC .............. *H01M 2/18* (2013.01); *G06F 17/50* (2013.01); *H01M 10/04* (2013.01); *H01M 10/613* (2015.04); *H01M 10/625* (2015.04); *H01M 10/6554* (2015.04); *H01M 10/6555* (2015.04); *H01M 10/647* (2015.04); *H01M 2220/20* (2013.01)

(58) Field of Classification Search
CPC .... H01M 2/18; H01M 10/04; H01M 2220/20; H01M 10/625; H01M 10/6555; H01M 10/6554; H01M 10/613; G06F 17/50
See application file for complete search history.

(56) References Cited

U.S. PATENT DOCUMENTS 5,470,357 A * 11/1995 Schmutz et al. ........... C08J 9/28
29/623.1
6,187,472 B1 * 2/2001 Shiota ................. H01M 2/0212
429/127
8,124,262 B2 2/2012 Okada et al.
(Continued)

FOREIGN PATENT DOCUMENTS

DE 102011120187 * 6/2013 .......... H01M 2/1061
GB 2399540 * 3/2003 ............... B63B 3/20
(Continued)

*Primary Examiner* — Patrick Ryan
*Assistant Examiner* — Aaron Greso
(74) *Attorney, Agent, or Firm* — Carlson, Gaskey & Olds

(57) ABSTRACT

A battery cell separator according to an exemplary aspect of the present disclosure includes, among other things, a top surface and a bottom surface. A body extends between the top surface and the bottom surface and includes a first contoured surface on a first side of the body and a second contoured surface on a second side. The first contoured surface and the second contoured surface converging between the top surface and a center of the body and diverging between the center and the bottom surface.

20 Claims, 4 Drawing Sheets

(51) Int. Cl.
*G06F 17/50* (2006.01)
*H01M 10/647* (2014.01)

(56) References Cited

U.S. PATENT DOCUMENTS

| | | |
|---|---|---|
| 8,268,474 B2 | 9/2012 | Kim et al. |
| 8,481,191 B2 | 7/2013 | Hermann |
| 2003/0152764 A1* | 8/2003 | Bunyan ............... C09K 5/063 428/328 |
| 2012/0009455 A1 | 1/2012 | Yoon |
| 2012/0177952 A1 | 7/2012 | Maguire et al. |
| 2013/0157098 A1* | 6/2013 | McLaughlin et al. ............ H01M 10/6555 429/120 |
| 2013/0171497 A1* | 7/2013 | Enomoto ............... H01M 2/18 429/136 |
| 2013/0273404 A1 | 10/2013 | Ochi et al. |
| 2014/0014420 A1 | 1/2014 | Nakamura et al. |

FOREIGN PATENT DOCUMENTS

| | | | | |
|---|---|---|---|---|
| JP | H09-245762 | * | 9/1997 | ............ H01M 2/16 |
| JP | 2001283897 | * | 10/2001 | ............ H01M 2/18 |
| JP | 2008192570 A | | 8/2008 | |
| JP | 2010287550 A | | 12/2010 | |
| JP | 2011076779 A | | 4/2011 | |
| WO | WO 2012/036088 | * | 3/2012 | ............ H01M 10/04 |
| WO | 2013083237 A1 | | 6/2013 | |

\* cited by examiner

BATTERY CELL SEPARATOR HAVING CONTOURED PROFILE

TECHNICAL FIELD

This disclosure relates to a battery assembly for an electrified vehicle. The battery assembly includes a battery cell separator, or spacer, having a contoured profile that can be matched to a bulged profile of a battery cell positioned adjacent to the battery cell separator.

BACKGROUND

The need to reduce automotive fuel consumption and emissions is well known. Therefore, vehicles are being developed that reduce reliance or completely eliminate reliance on internal combustion engines. Electrified vehicles are one type of vehicle currently being developed for this purpose. In general, electrified vehicles differ from conventional motor vehicles in that they are selectively driven by one or more battery powered electric machines. Conventional motor vehicles, by contrast, rely exclusively on the internal combustion engine to drive the vehicle.

High voltage batteries for powering the electric machines of an electrified vehicle typically include multiple battery arrays. Each battery array includes a plurality of battery cells and a plurality of separators that are arranged between adjacent battery cells. The battery cells and separators are often stacked side-by-side in an alternating fashion to physically separate the adjacent battery cells from one another.

From time to time, such as when charging the battery cells, the external profile of the battery cells may bulge or swell. The bulging can alter the interface between the cell and the separator such that the battery cell is not in complete contact with the separator.

SUMMARY

A battery cell separator according to an exemplary aspect of the present disclosure includes, among other things, a top surface and a bottom surface. A body extends between the top surface and the bottom surface and includes a first contoured surface on a first side of the body and a second contoured surface on a second side. The contoured surface and the second contoured surface converge between the top surface and a center of the body and diverge between the center and the bottom surface.

In a further non-limiting embodiment of the foregoing battery cell separator, the first contoured surface and the second contoured surface extend in parallel between converging and diverging portions of the body.

In a further non-limiting embodiment of either of the foregoing battery cell separators, the top surface includes a flange.

In a further non-limiting embodiment of any of the foregoing battery cell separators, the flange establishes a pocket on each of the first side and the second side of the body.

In a further non-limiting embodiment of any of the foregoing battery cell separators, the flange extends over top of at least one battery cell received against the body.

In a further non-limiting embodiment of any of the foregoing battery cell separators, the first contoured surface and the second contoured surface converge from the top surface to the center, and then diverge from the center to the bottom surface.

In a further non-limiting embodiment of any of the foregoing battery cell separators, the body is made of a thermally conductive material.

In a further non-limiting embodiment of any of the foregoing battery cell separators, the top surface, the bottom surface and the body are a single piece, unitary part having a monolithic structure.

In a further non-limiting embodiment of any of the foregoing battery cell separators, a profile of at least one of the first contoured surface and the second contoured surface is matched to a bulged profile of a battery cell that is received adjacent to the first contoured surface or the second contoured surface.

A battery assembly according to another exemplary aspect of the present disclosure includes, among other things, a battery cell that includes an uncharged profile having a first contour and a charged profile having a second contour different from the first contour and a battery cell separator including a contoured surface having a profile matched to the charged profile of the battery cell.

In a further non-limiting embodiment of the forgoing battery assembly, the first contour is substantially flat and the second contour is at least partially bulged.

In a further non-limiting embodiment of either of the foregoing battery assemblies, the battery cell and the battery cell separator are positioned atop a cold plate and extend in the same horizontal plane along a top of the cold plate.

In a further non-limiting embodiment of any of the foregoing battery assemblies, the assembly includes a thermal interface material between the cold plate and the battery cell and the battery cell separator.

In a further non-limiting embodiment of any of the foregoing battery assemblies, an exterior surface of the battery cell bulges between a first position having the first contour and a second position having the second contour.

In a further non-limiting embodiment of any of the foregoing battery assemblies, the first contour and the second contour are contours of an exterior surface of the battery cell.

In a further non-limiting embodiment of any of the foregoing battery assemblies, the battery cell separator includes a top surface, a bottom surface, and a body extending between the top surface and the bottom surface, the body including a first side and a second side, and the contoured surface is located on at least one of the first side and the second side.

In a further non-limiting embodiment of any of the foregoing battery assemblies, the body includes a first contoured surface on the first side and a second contoured surface on the second side, the first contoured surface and the second contoured surface converging between the top surface and a center of the body and diverging between the center and the bottom surface.

In a further non-limiting embodiment of any of the foregoing battery assemblies, a middle of an exterior surface of the battery cell contacts the contoured surface of the battery cell separator during the charged profile but is spaced from the contoured surface during the uncharged profile.

In a further non-limiting embodiment of any of the foregoing battery assemblies, the battery cell separator includes a flange that establishes a pocket, the battery cell received within the pocket.

A method according to another exemplary aspect of the present disclosure includes, among other things, mapping a contour of an exterior surface of a battery cell at a desired charging state of the battery cell and matching a profile of a battery cell separator to a profile of the contour of the exterior surface of the battery cell at the desired charging state.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure describes a battery assembly for an electrified vehicle. The battery assembly may include one or more battery cell separators that divide adjacent battery cells of the battery assembly from one another. The battery cell separators may include a contoured surface having a profile that is matched to a bulged profile of a battery cell. These and other features are discussed in greater detail in the following paragraphs of this disclosure.

Figure 1:
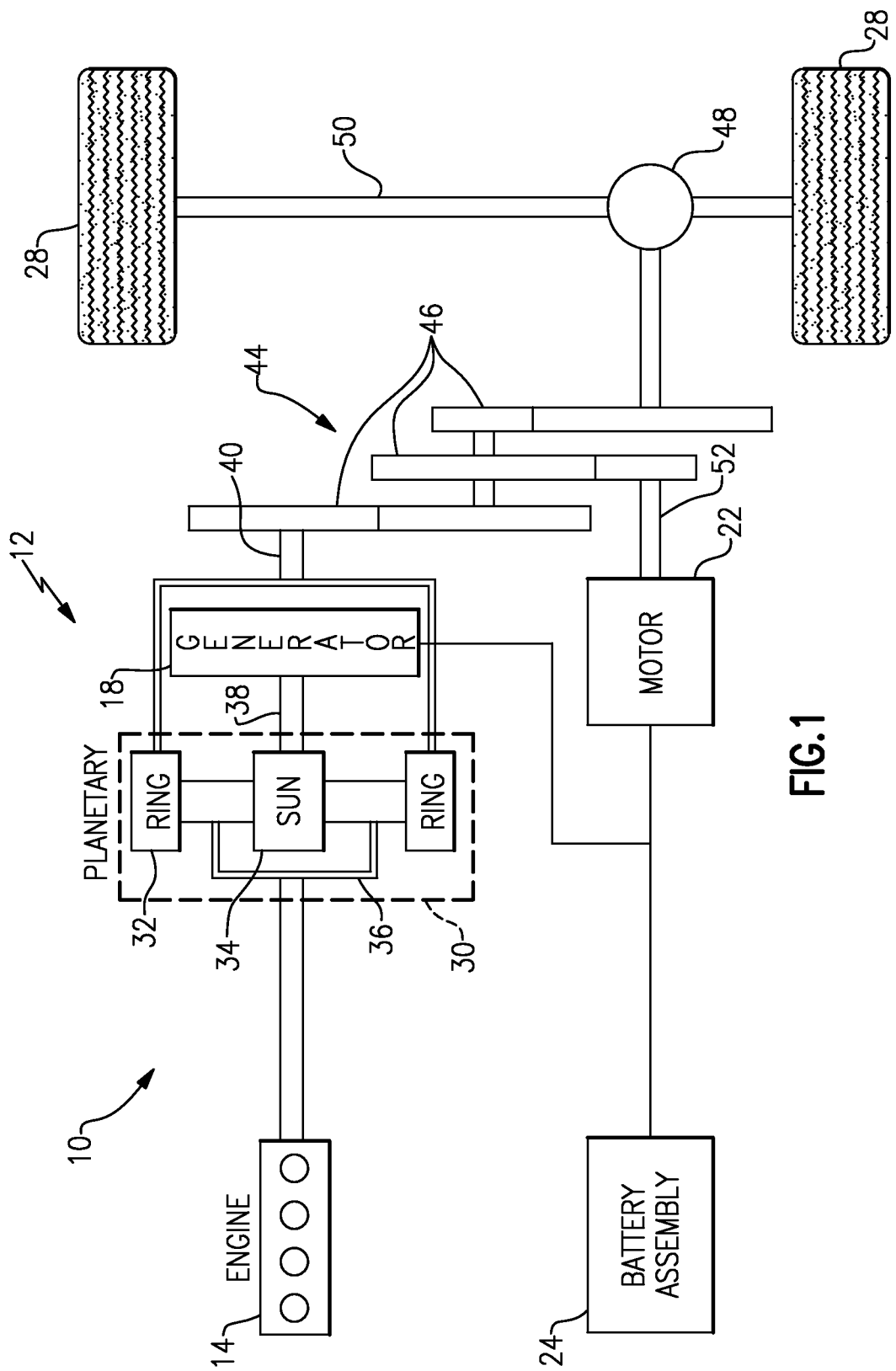
FIG. 1 schematically illustrates a powertrain of an electrified vehicle.

FIG. 1 schematically illustrates a powertrain 10 for an electrified vehicle 12. Although depicted as a hybrid electric vehicle (HEV) in this non-limiting embodiment, it should be understood that the concepts described herein are not limited to HEV's and could extend to other electrified vehicles, including, but not limited to, plug-in hybrid electric vehicles (PHEV's), battery electric vehicles (BEV's), and fuel cell vehicles (FCV's).

In one embodiment, the powertrain 10 is a power-split powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems generate torque to drive one or more sets of vehicle drive wheels 28 of the electrified vehicle 12.

The engine 14, such as an internal combustion engine, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In one embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery pack 24.

The battery pack 24 is an example type of electrified vehicle battery assembly. The battery pack 24 may be a high voltage battery pack that includes a plurality of battery arrays capable of outputting electrical power to operate the motor 22 and the generator 18. Other types of energy storage devices and/or output devices can also be used to electrically power the electrified vehicle 12.

In one non-limiting embodiment, the electrified vehicle 12 has two basic operating modes. The electrified vehicle 12 may operate in an Electric Vehicle (EV) mode where the motor 22 is used (generally without assistance from the engine 14) for vehicle propulsion, thereby depleting the battery pack 24 state of charge up to its maximum allowable discharging rate under certain driving patterns/cycles. The EV mode is an example of a charge depleting mode of operation for the electrified vehicle 12. During EV mode, the state of charge of the battery pack 24 may increase in some circumstances, for example due to a period of regenerative braking. The engine 14 is generally OFF under a default EV mode but could be operated as necessary based on a vehicle system state or as permitted by the operator.

The electrified vehicle 12 may additionally be operated in a Hybrid (HEV) mode in which the engine 14 and the motor 22 are both used for vehicle propulsion. The HEV mode is an example of a charge sustaining mode of operation for the electrified vehicle 12. During the HEV mode, the electrified vehicle 12 may reduce the motor 22 propulsion usage in order to maintain the state of charge of the battery pack 24 at a constant or approximately constant level by increasing the engine 14 propulsion usage. The electrified vehicle 12 may be operated in other operating modes in addition to the EV and HEV modes within the scope of this disclosure.

Figure 2:
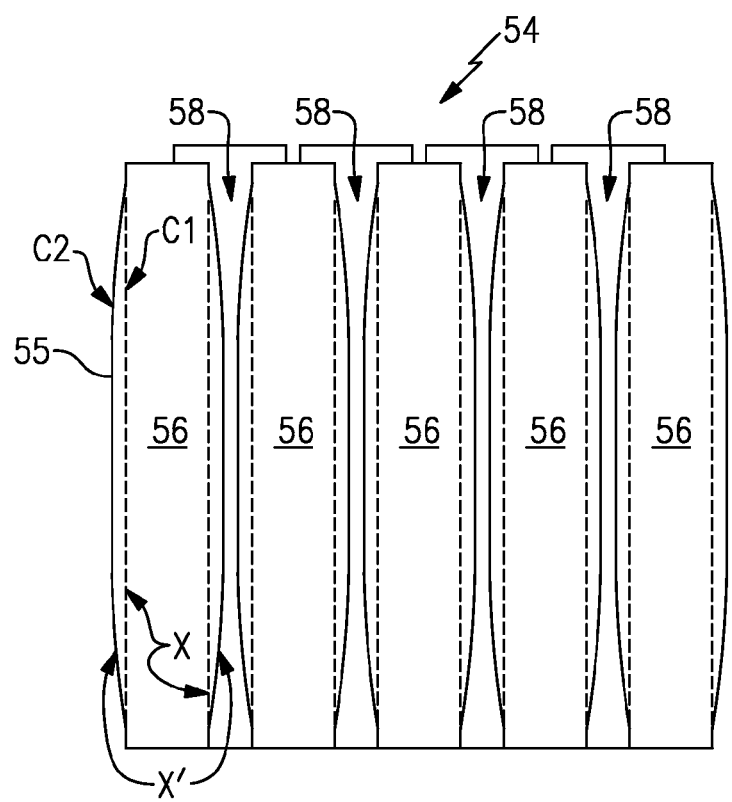
FIG. 2 illustrates a battery assembly of an electrified vehicle.

FIG. 2 illustrates a battery assembly 54 that includes a plurality of battery cells 56 and a plurality of battery cell separators 58. The battery cell separators 58 may also be referred to as spacers or dividers. The battery assembly 54 could include any number of cells and/or separators as well as other parts and components, and this disclosure is not limited to specific configuration illustrated by FIG. 2.

The battery cell separators 58 are arranged to separate adjacent battery cells 56 from one another. For example, a plurality of battery cells 56 and a plurality of battery cell separators 58 may be arranged side-by-side in an alternating fashion to construct the battery assembly 54. Various support structures, such as end plates and railing, may be mounted to the battery assembly 54 to assemble a battery array, which can then be mounted inside a battery pack, such as the battery pack 24 of the electrified vehicle 12 of FIG. 1.

In one embodiment, the battery cells 56 are prismatic, lithium-ion cells. However, other types of battery cells, including but not limited to pouch cells, are also contemplated within the scope of this disclosure.

The battery cell separators 58 may provide a dielectric barrier between adjacent battery cells 56 of the battery assembly 54. In one embodiment, the battery cell separators 58 are single piece, unitary or molded parts having a monolithic structure. In one non-limiting embodiment, each battery cell separator 58 can accommodate two battery cells 56.

The battery cell separators 58 may be made of a thermally conductive material. In one embodiment, the battery cell separators 58 are made of high density polyethylene (HDPE). In another embodiment, the battery cell separators 58 are made of polypropylene (PP). Other thermally conductive materials, or combinations of materials, could also be utilized to construct the battery cell separators 58.

Figure 3:
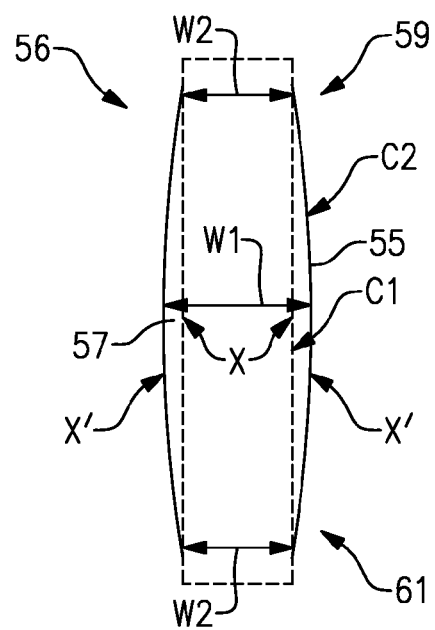
FIG. 3 illustrates a battery cell of a battery assembly.

Referring now to FIGS. 2 and 3, the battery cells 56 of the battery assembly 54 may bulge, swell, or expand during certain conditions, such as charging conditions, between a first position X (shown in phantom lines) and a second position X' (shown in solid lines). The battery cells 56 may bulge to any position between the first position X and the second position X', which may be caused by heat generation or chemical reactions that occur inside the battery cells 56.

In one non-limiting embodiment, the first position X is an uncharged profile of the battery cell 56 and the second position is a charged profile. An exterior surface 55 of the battery cell 56 may include a first contour C1 in the first position X and a second contour C2 that is different from the first contour C1 in the second position X'. In one embodiment, the first contour C1 is substantially flat (i.e., extends in a single plane) and the second contour C2 is at least partially bulged outwardly (i.e., is not planar). In the second position X', the battery cell 56 swells near a middle 57 of the exterior surface 55 to render the second contour C2. The middle 57 of the battery cell 56 includes a width W1 that is greater than a width W2 of a top portion 59 and bottom portion 61 of the battery cell 56 in the second position X' (best shown in FIG. 3).

The battery cell separators 58 may include a profile that is matched to a charged (i.e., bulged) profile of the battery cells 56. For example, a contour of the exterior surface 55 of the battery cell 56 may be mapped out over various charging states that span from zero charge to maximum charge. The amount of bulging that will be experienced by a battery cell 56 can be calculated for any given charging state. The profile of the battery cell separator 58 can then be matched to the profile of the exterior surface 55 of the battery cell 56 for a desired charging state.

In one embodiment, the "matched" surface profile of the battery cell separator 58 is the dimensional opposite of the profile of the exterior surface 55 of the battery cell 56 for any given charging state. The matched profiles improve contact between the battery cell 56 and the battery cell separator 58 of the battery assembly 54. In another embodiment, there is complete contact at the interface between the battery cell 56 and the battery cell separator 58 during charged or bulged profiles of the battery cell 56. The middle 57 of the exterior surface 55 of the battery cell 56 may contact the battery cell separator 58 during a charged profile but may be partially spaced from the battery cell separator 58 during uncharged profiles.

In one non-limiting embodiment, the profile of the battery cell separator 58 is matched to the profile the exterior surface 55 of the battery cell 56 exhibits during a normal charging state, such as 20%-60% state of charge. However, the profile of the battery cell separator 58 may be matched to any profile of the exterior surface 55 at any charging state. Example embodiments of battery cell separator designs with matched surface profiles are illustrated below in FIGS. 4-6.

Figure 4:
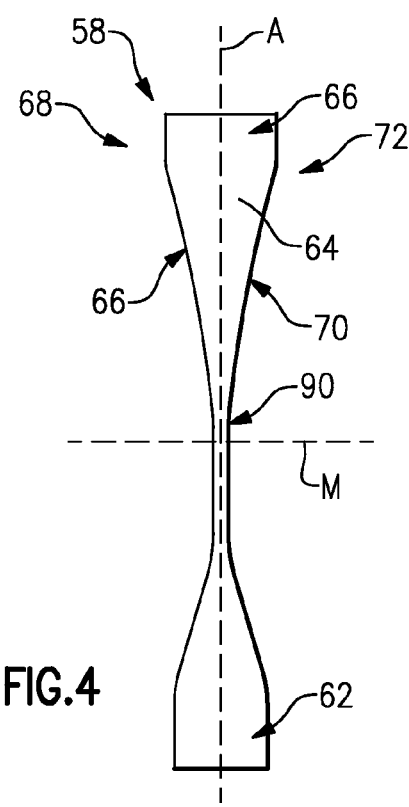
FIG. 4 illustrates a battery cell separator according to a first embodiment of this disclosure.

FIG. 4 illustrates a battery cell separator 58. The battery cell separator 58 includes a top surface 60, a bottom surface 62 and a body 64 that extends between the top surface 60 and the bottom surface 62 along a longitudinal axis A. The body 64 may include a first contoured surface 66 at a first side 68 of the body 64 and a second contoured surface 70 at a second side 72 of the body 64.

Battery cells 56 may be received against one or both of the first contoured surface 66 and the second contoured surface 70 (see FIG. 2). In one embodiment, the first contoured surface 66 and the second contoured surface 70 include surface profiles that are matched to a bulged profile of an exterior surface 55 of the battery cells 56. In this way, the battery cell separators 58 provide uniform surface contact with the battery cells 56, enhance heat dissipation from the battery cells 56, and maintain a minimized temperature differential between the battery cells 56, even during charged conditions in which the battery cells 56 bulge or swell between the first position X and the second position X' (see FIGS. 2 and 3).

In one non-limiting embodiment, the first contoured surface 66 and the second contoured surface 70 converge between the top surface 60 and a center 90 of the body 64, and then diverge between the center 90 and the bottom surface 62 of the body 64. A central axis M that is transverse to the longitudinal axis A extends through the center 90 of the body 64. These converging and diverging surfaces establish the contoured profile necessary to match a charged or bulged profile of the battery cells 56 that engage the battery cell separator 58.

Figure 5:
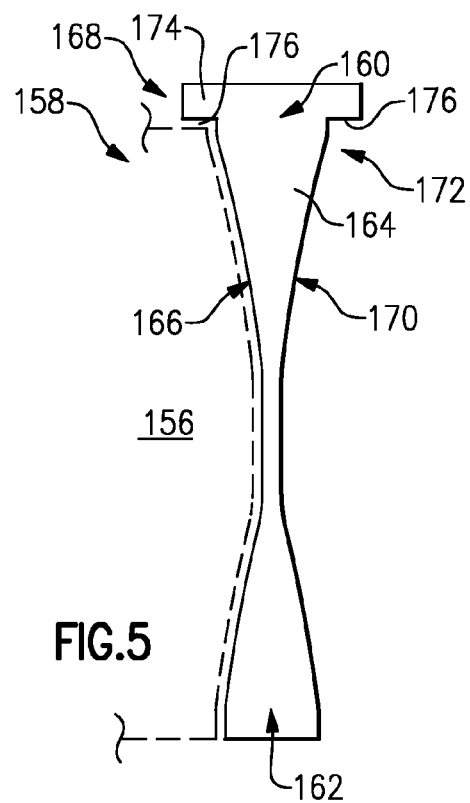
FIG. 5 illustrates a battery cell separator according to a second embodiment of this disclosure.

FIG. 5 illustrates a battery cell separator 158 according to another embodiment of this disclosure. In this disclosure, like reference numbers designate like elements where appropriate and reference numerals with the addition of 100 or multiples thereof designate modified elements that are understood to incorporate the same features and benefits of the corresponding original elements.

The battery cell separator 158 is similar to the battery cell separator 58 of FIG. 4 and includes a top surface 160, a bottom surface 162, a body 164 that extends between the top surface 160 and the bottom surface 162, and first and second contoured surfaces 166, 170. However, in this embodiment, the top surface 160 of the battery cell separator 158 includes a flange 174. The flange 174 may extend over top of the battery cells 156 and aids in holding the battery cells 156 in proper alignment against the battery cell separator 158. In one embodiment, the flange 174 establishes a pocket 176 at both a first side 168 and a second side 172 of the body 164 for receiving the battery cells 156.

Figure 6:
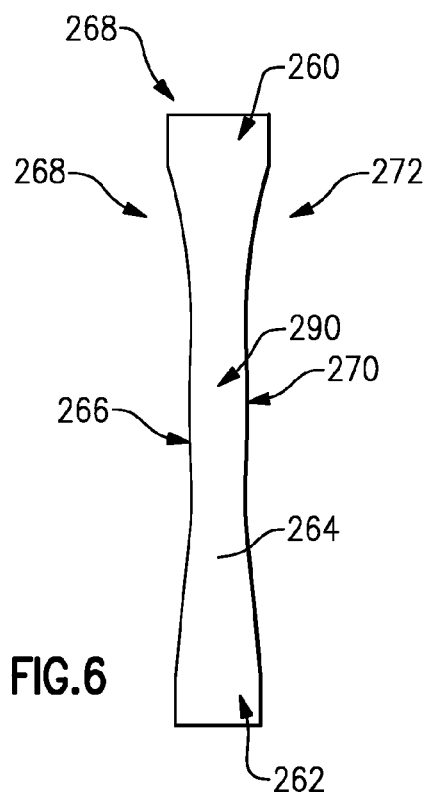
FIG. 6 illustrates a battery cell separator according to another embodiment of this disclosure.

FIG. 6 illustrates yet another battery cell separator 258. The battery cell separator 258 includes a top surface 260, a bottom surface 262, a body 264 that extends between the top surface 260 and the bottom surface 262, a first contoured surface 266 on a first side 268 of the body 264, and a second contoured surface 270 on a second side 272 of the body 264. In this embodiment, the first contoured surface 266 and the second contoured surface 270 converge from the top surface 260 toward a center 290 of the body 264, then extend in parallel, and then diverge toward the bottom surface 262.

Figure 7:
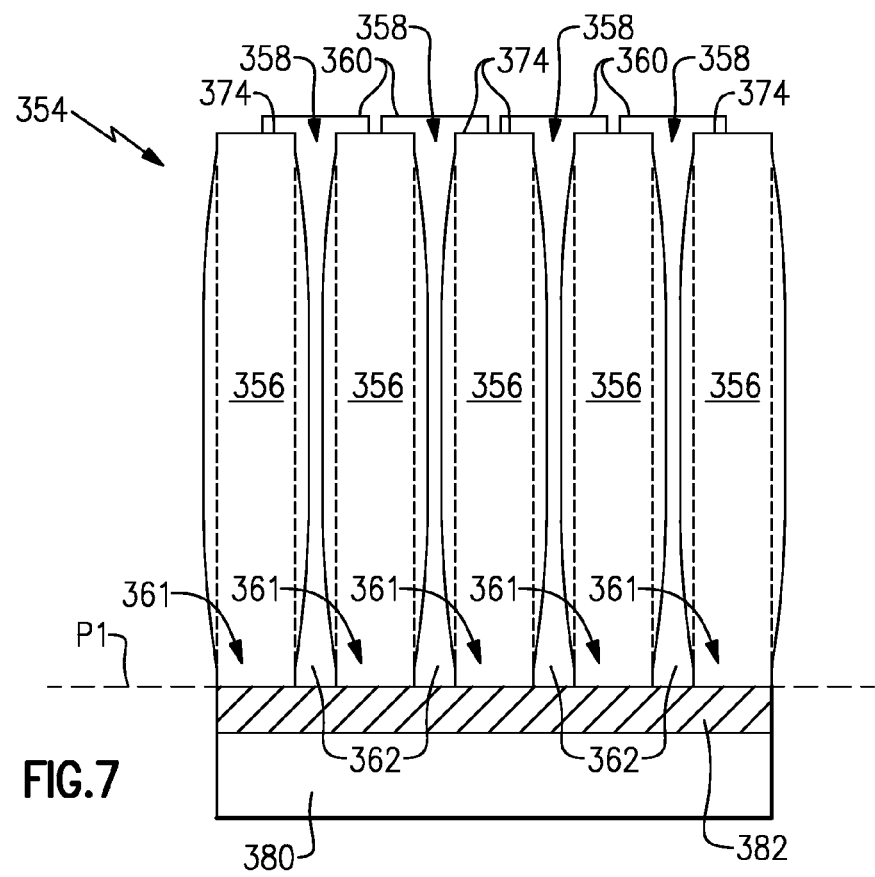
FIG. 7 illustrates a battery assembly according to a second embodiment of this disclosure.

FIG. 7 illustrates another battery assembly 354. The battery assembly 354 may include a plurality of battery cells 356, a plurality of battery cell separators 358, and a cold plate 380. A thermal interface material 382 may be positioned between the battery cells 356/battery cell separators 358 and the cold plate 380, in one non-limiting embodiment.

Each battery cell separator 358 may include a flange 374 at a top surface 360. The flanges 374 align and hold the battery cells 356 in engagement with the battery cell separators 358 and the cold plate 380/thermal interface material 382. In another embodiment, the bottom surfaces 362 of the battery cell separators 358 and bottom portions 361 of the battery cells 356 are configured in a straight, horizontal plane P1 and each contact the cold plate 380/thermal interface material 382.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A battery assembly, comprising:
a battery cell that includes an external uncharged profile having a first contour and an external charged profile having a second contour when charged, wherein the second contour differs from said first contour; and
a battery cell separator, external to said battery cell, including a contoured surface having a profile matched to said external charged profile of said battery cell; said battery cell and said battery cell separator arranged side-by-side.

2. The battery assembly as recited in claim 1, wherein said first contour is substantially flat and said second contour is at least partially bulged.

3. The battery assembly as recited in claim 1, wherein said battery cell and said battery cell separator are positioned atop a cold plate and extend in the same horizontal plane along a top of said cold plate.

4. The battery assembly as recited in claim 3, comprising a thermal interface material between said cold plate and said battery cell and said battery cell separator.

5. The battery assembly as recited in claim 1, wherein an exterior surface of said battery cell bulges between a first position having said first contour and a second position having said second contour.

6. The battery assembly as recited in claim 1, wherein said first contour and said second contour are contours of an exterior surface of said battery cell.

7. The battery assembly as recited in claim 1, wherein said battery cell separator includes a top surface, a bottom surface, and a body extending between said top surface and said bottom surface, said body including a first side and a second side, and said contoured surface is located on at least one of said first side and said second side.

8. The battery assembly as recited in claim 7, wherein said body includes a first contoured surface on said first side and a second contoured surface on said second side, said first contoured surface and said second contoured surface converging between said top surface and a center of said body and diverging between said center and said bottom surface.

9. The battery assembly as recited in claim 1, wherein a middle of an exterior surface of said battery cell contacts said contoured surface of said battery cell separator during said charged profile but is spaced from said contoured surface during said uncharged profile.

10. The battery assembly as recited in claim 1, wherein said battery cell separator includes a flange that establishes a pocket, said battery cell received within said pocket.

11. The battery assembly as recited in claim 1, wherein said battery cell separator is contiguous with an external surface of said battery cell.

12. The battery assembly as recited in claim 1, wherein said battery cell separator is made of a polymeric material.

13. The battery assembly as recited in claim 12, wherein said polymeric material includes a high density polyethylene (HDPE).

14. The battery assembly as recited in claim 12, wherein said polymeric material includes polypropylene (PP).

15. The battery assembly as recited in claim 1, wherein said battery cell is disposed on a first side of said battery cell separator and a second battery cell is disposed on a second side of said battery cell separator.

16. The battery assembly as recited in claim 15, wherein said battery cell separator includes a second contoured surface having a second profile matched to a charged profile of said second battery cell.

17. The battery assembly as recited in claim 1, wherein said profile of said contoured surface is dimensionally opposite of said charged profile of said battery cell.

18. A battery assembly, comprising:
a first battery cell with a first uncharged profile and a second charged profile when charged;
a second battery cell with a first uncharged profile and a second charged profile when charged;
wherein the second charged profiles are different from the first uncharged profiles; and
a separator establishing a dielectric barrier between said first battery cell and said second battery cell, said separator including a first contoured surface having a first profile matched to said second charged profile of said first battery cell and a second contoured surface having a second profile matched to said second charged profile of said second battery cell.

19. The battery assembly as recited in claim 18, wherein said separator includes a body that extends between a top surface and a bottom surface, said first contoured surface and said second contoured surface converging between said top surface and a center of said body and diverging between said center and said bottom surface.

20. The battery assembly as recited in claim 18, wherein said separator includes a flange that extends over top of a portion of both said first battery cell and said second battery cell.

\* \* \* \* \*